US011456154B2

(12) United States Patent
Park et al.

(10) Patent No.: US 11,456,154 B2
(45) Date of Patent: Sep. 27, 2022

(54) PLASMA-GENERATING UNIT AND SUBSTRATE TREATMENT APPARATUS INCLUDING THE SAME

(71) Applicant: Semes Co., Ltd., Cheonan-si (KR)

(72) Inventors: Seung-Jin Park, Cheonan-si (KR); Hyoseong Seong, Changwon-si (KR); Jung Min Won, Cheonan-si (KR); Doo ho Lim, Suwon-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1369 days.

(21) Appl. No.: 14/685,107

(22) Filed: Apr. 13, 2015

(65) Prior Publication Data

US 2015/0311038 A1 Oct. 29, 2015

(30) Foreign Application Priority Data

Apr. 29, 2014 (KR) .................. 10-2014-0051709

(51) Int. Cl.
*H01J 37/32* (2006.01)
*C23C 16/505* (2006.01)

(52) U.S. Cl.
CPC ........ *H01J 37/3211* (2013.01); *C23C 16/505* (2013.01); *H01J 37/32174* (2013.01)

(58) Field of Classification Search
CPC ....... H01J 37/244; H01J 37/321–32119; H01J 37/32174; H01J 37/32183; H01J 37/3244; H01J 37/32577; H01J 37/32935; H05H 2001/4652; H05H 2001/4667; H05H 2001/4682; H05H 2007/025; C23C 16/505

See application file for complete search history.

(56) References Cited

U.S. PATENT DOCUMENTS

| 5,349,313 | A | * | 9/1994 | Collins | .................. | H03H 7/48 333/100 |
| 6,036,878 | A | * | 3/2000 | Collins | ................ | H01J 37/321 216/68 |
| 6,462,481 | B1 | * | 10/2002 | Holland | ................ | H01J 37/321 315/111.21 |

(Continued)

FOREIGN PATENT DOCUMENTS

| CN | 101853764 A | 10/2010 |
| CN | 102054648 A | 5/2011 |

(Continued)

*Primary Examiner* — Benjamin Kendall
(74) *Attorney, Agent, or Firm* — Harness, Dickey & Pierce, P.L.C.

(57) ABSTRACT

Provided is a substrate treatment apparatus including a process chamber, a supporting unit, a gas supplying unit, and a plasma generating unit. The plasma generating unit may include a power, a primary antenna connected to the power through a first line, a secondary antenna connected to the power through a second line diverging from the first line at a first junction, the primary and secondary antennas being connected in parallel to the power, a third reactance device connected to the power through a third line diverging from the second line at a second junction, the secondary antenna and the third reactance device being connected in parallel to the power, and a variable reactance installed on the second line between the second junction and the secondary antenna.

20 Claims, 4 Drawing Sheets

(56) References Cited

U.S. PATENT DOCUMENTS

| | | | | |
|---|---|---|---|---|
| 6,507,155 B1* | 1/2003 | Barnes | ............ | H01J 37/321 118/723 R |
| 6,617,794 B2* | 9/2003 | Barnes | ............ | H01J 37/321 118/723 R |
| 6,685,798 B1* | 2/2004 | Holland | ............ | H01J 37/321 118/723 AN |
| 6,694,915 B1* | 2/2004 | Holland | ............ | H01J 37/321 118/715 |
| 2009/0284156 A1* | 11/2009 | Banna | ............ | H01J 37/321 315/111.21 |
| 2012/0145322 A1 | 6/2012 | Gushiken et al. | | |
| 2012/0248066 A1* | 10/2012 | Yamazawa | ............ | H01J 37/321 216/68 |
| 2013/0134877 A1* | 5/2013 | Kim | ............ | H01J 37/32091 315/111.21 |
| 2013/0278142 A1* | 10/2013 | Dorf | ............ | H01J 37/32183 315/111.41 |
| 2015/0179406 A1* | 6/2015 | Johnson | ............ | H01J 37/32183 156/345.48 |
| 2015/0235810 A1* | 8/2015 | Long | ............ | H01J 37/32183 156/345.51 |

FOREIGN PATENT DOCUMENTS

| | | | |
|---|---|---|---|
| CN | 103108483 A | 5/2013 | |
| KR | 100645469 B1 | 11/2006 | |
| KR | 100773204 B1 | 11/2007 | |
| KR | 20110022952 A | 3/2011 | |
| KR | 20110046256 A | 5/2011 | |
| KR | 101115273 B1 | 3/2012 | |
| KR | 20130054184 A | 5/2013 | |

* cited by examiner

PLASMA-GENERATING UNIT AND SUBSTRATE TREATMENT APPARATUS INCLUDING THE SAME

CROSS-REFERENCE TO RELATED APPLICATIONS

This U.S. non-provisional patent application claims priority under 35 U.S.C. § 119 to Korean Patent Application No. 10-2014-0051709, filed on Apr. 29, 2014, in the Korean Intellectual Property Office, the entire contents of which are hereby incorporated by reference.

BACKGROUND OF THE INVENTION

Example embodiments of the inventive concept relate to a plasma-generating unit and a substrate treatment apparatus including the same.

A semiconductor fabrication process may include a process of treating a substrate using plasma. For example, the semiconductor fabrication process may include an etching process of removing a thin film formed on a substrate using plasma.

To exploit the plasma in a substrate treatment process, a plasma generating unit for generating plasma is provided in a process chamber. The plasma generating unit may be classified into two types, capacitively-coupled plasma (CCP) type and inductively-coupled plasma (ICP) type, depending on a generating way of plasma.

For a CCP-type plasma source, two electrodes are disposed in a chamber to face each other, and by applying an RF signal to one or both of the two electrodes, it is possible to produce an electric field for generating plasma in the chamber. By contrast, for an ICP-type plasma source, one or more coils are disposed in a chamber, and by applying an RF signal to the coil, it is possible to induce an electromagnetic field for generating plasma in the chamber.

In the case where a plurality of coils are disposed in the chamber and an electric power supplied from a single RF power are applied to two or more coils, a power divider may be provided between the RF power and the coils. The power divider may divide the electric power supplied from the RF power to respective coils, in accordance with a predetermined ratio. However, for a conventional power divider, a controllable range of such a power dividing is very limited.

SUMMARY

Example embodiments of the inventive concept provide a plasma generating unit, allowing for a control of an amount of electric power to be supplied to each of coils in a wide range, and a substrate treatment apparatus including the same.

Example embodiments of the inventive concept provide a substrate treatment apparatus.

According to example embodiments of the inventive concept, a substrate treatment apparatus may include a process chamber, a supporting unit provided in the process chamber to support a substrate, a gas supplying unit supplying a process gas into the process chamber, and a plasma generating unit generating plasma from the process gas supplied into the process chamber. The plasma generating unit may include a high frequency power, a primary antenna connected to the high frequency power through a first line, a secondary antenna connected to the high frequency power through a second line diverging from the first line at a first junction, the primary and secondary antennas being connected in parallel to the high frequency power, a third reactance device connected to the high frequency power through a third line diverging from the second line at a second junction, the secondary antenna and the third reactance device being connected in parallel to the high frequency power, and a variable reactance device installed on a segment of the second line positioned between the second junction and the secondary antenna.

In example embodiments, the plasma generating unit may further include a second reactance device provided on another segment of the second line positioned between the first and second junctions and connected in series to the secondary antenna.

In example embodiments, the plasma generating unit may further include a first reactance device installed on the first line.

In example embodiments, the variable reactance device may include a variable capacitor connected in series to the secondary antenna.

In example embodiments, the first reactance device may be an inductor.

In example embodiments, the second reactance device may be a capacitor.

In example embodiments, the third reactance device may be a capacitor.

In example embodiments, the primary antenna and the secondary antenna may be provided in the form of a ring and the primary antenna may have a radius smaller than that of the secondary antenna.

In example embodiments, the primary and secondary antennas may be provided on a top part of the process chamber.

In example embodiments, the primary and secondary antennas may be provided on a sidewall of the process chamber.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
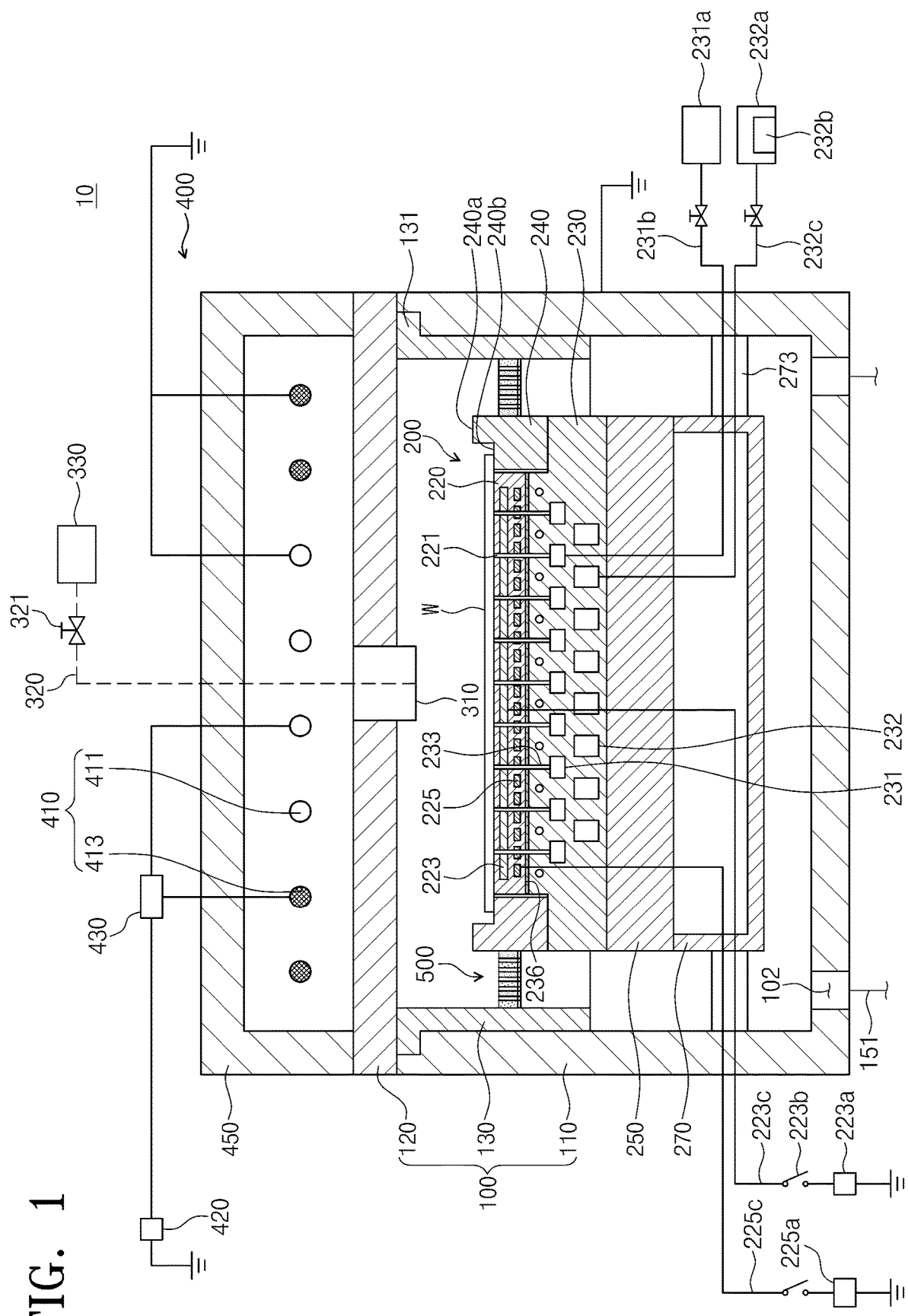
FIG. 1 is a diagram exemplarily illustrating a substrate treatment apparatus according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the description that follows will refer to an example of the present embodiment in which a substrate treatment apparatus is configured to perform a plasma etching process on a substrate. However, example embodiments of the inventive concepts may not be limited thereto. For example, the inventive concept may be applied to realize an apparatus for heating a substrate provided thereon.

FIG. 1 is a schematic diagram illustrating an example of a substrate treatment apparatus 10 according to example embodiments of the inventive concept.

Referring to FIG. 1, a substrate treatment apparatus 10 may treat a substrate W using plasma. For example, the substrate treatment apparatus 10 may be configured to perform an etching process on the substrate W. The substrate treatment apparatus 10 may include a process chamber 100, a supporting unit 200, a gas supplying unit 300, a plasma generating unit 400, and a baffle unit 500.

The process chamber 100 may provide a space, in which a substrate treatment process will be performed. The process chamber 100 may include a housing 110, a sealing cover 120, and a liner 130.

The housing 110 may provide a top-open internal space. The housing 110 may be configured to allow a substrate treatment process to be performed in the internal space thereof. The housing 110 may be formed of or include a metallic material. As an example, the housing 110 may be formed of an aluminum-containing material. The housing 110 may be connected to a ground voltage. An exhausting hole 102 may be formed through a bottom surface of the housing 110. The exhausting hole 102 may be connected to an exhausting line 151. A reaction side-product, which may be produced during the substrate treating process, and a remnant gas existing in the internal space of the housing 110 may be exhausted to the outside through the exhausting line 151. As a result of the exhausting process, the housing 110 may be decompressed to a predetermined pressure.

The sealing cover 120 may be provided to cover the open top of the housing 110. The sealing cover 120 may be provided in the form of a plate to allow the internal space of the housing 110 to be hermetically sealed. The sealing cover 120 may include a dielectric window.

The liner 130 may be provided in the housing 110. The liner 130 may be disposed in a top and bottom open space. The liner 130 may be provided in the form of a cylinder. The liner 130 may have a radius which corresponds or equals to that of the internal space of the housing 110. The liner 130 may be provided along or on an inner side surface of the housing 110. A supporting ring 131 may be provided at a top portion of the liner 130. The supporting ring 131 may be provided in the form of a ring-shaped plate and may protrude outward from an outer circumference of the liner 130. The supporting ring 131 may be disposed atop the housing 110 to support the liner 130. The liner 130 may be formed of or include the same material as that of the housing 110. For example, the liner 130 may be formed of an aluminum-containing material. The liner 130 may protect the inner side surface of the housing 110 against damage. During excitation of a process gas, arc discharge may occur in the chamber 100. Such an arc discharge may lead to damage to neighboring devices. However, by virtue of the liner 130 provided on the inner side surface of the housing 110, it is possible to prevent the inner side surface of the housing 110 from being damaged by the arc discharge. Further, the liner 130 may prevent a pollutant material, which may be produced in the substrate treatment process, from being deposited on the inner side surface of the housing 110. The liner 130 may be cost effective and easily replaceable when compared with the housing 110. Thus, in the case where the liner 130 is damaged by an arc discharge, the liner 130 can be replaced with a new one by an operator.

The supporting unit 200 may be positioned in the housing 110. The substrate supporting unit 200 may be configured to support the substrate W. The substrate supporting unit 200 may include an electrostatic chuck 210 configured to suction and hold the substrate W using an electrostatic force. Alternatively, the substrate supporting unit 200 may be configured to hold the substrate W using other ways such as a mechanical clamping. For the sake of simplicity, the description that follows will refer to an example of the present embodiment in which the supporting unit 200 with the electrostatic chuck 210 is provided.

The supporting unit 200 may include the electrostatic chuck 210, an insulating plate 250, and a lower cover 270. The supporting unit 200 may be provided in the chamber 100 to be spaced apart upward from the bottom surface of the housing 110.

The electrostatic chuck 210 may include a dielectric plate 220, an electrode 223, a heater 225, a supporting plate 230, and a focus ring 240.

The dielectric plate 220 may be provided atop the electrostatic chuck 210. The dielectric plate 220 may be shaped like a circular disk and may be formed of a dielectric material. The substrate W may be disposed on a top surface of the dielectric plate 220. The top surface of the dielectric plate 220 may have a radius smaller than that of the substrate W. Accordingly, an edge region of the substrate W may be positioned outside the dielectric plate 220. A first supplying conduit 221 may be provided in the dielectric plate 220. The first supplying conduit 221 may be provided to extend from the top surface of the dielectric plate 220 to the bottom surface. In example embodiments, a plurality of first supplying conduits 221 may be provided spaced apart from each other and may be used as pathways for supplying a heat transfer medium toward the bottom surface of the substrate W.

The lower electrode 223 and the heater 225 may be buried in the dielectric plate 220. The lower electrode 223 may be positioned on the heater 225. The lower electrode 223 may be electrically connected to a first lower power 223a. The first lower power 223a may include a DC power. A switch 223b may be installed between the lower electrode 223 and the first lower power 223a. The lower electrode 223 may be electrically connected or disconnected to the first lower power 223a by turning the switch 223b on or off. For example, if the switch 223b is turned on, a DC current may be applied to the lower electrode 223. Due to a current applied to the lower electrode 223, an electrostatic force may be generated between the lower electrode 223 and the substrate W, and as a result, the substrate W may be fastened to the dielectric plate 220.

The heater 225 may be electrically connected to a second lower power 225a. The heater 225 may generate heat using the current applied to the second lower power 225a. The generated heat may be transmitted to the substrate W through the dielectric plate 220. For example, the heat generated by the heater 225 may allow the substrate W to be at a predetermined temperature. The heater 225 may include at least one spiral coil.

The supporting plate 230 may be provided below the dielectric plate 220. The bottom surface of the dielectric plate 220 may be attached to a top surface of the supporting plate 230 by an adhesive layer 236. The supporting plate 230 may be formed of an aluminum-containing material. The top surface of the supporting plate 230 may be higher at a center region thereof than at an edge region thereof, thereby having a staircase structure. The center region of the top surface of the supporting plate 230 may have substantially the same or similar area as that of the bottom surface of the dielectric plate 220 and may be adhered to the bottom surface of the dielectric plate 220. A first circulation conduit 231, a second circulation conduit 232, and a second supplying conduit 233 may be formed in the supporting plate 230.

The first circulation conduit 231 may serve as a pathway, through which a heat transfer medium is circulated. The first circulation conduit 231 may be a spiral structure provided in the supporting plate 230. Alternatively, the first circulation conduit 231 may be configured to include a plurality of ring-shaped conduits, which are formed in a concentric manner, and whose radii are different from each other. In certain embodiments, the conduits constituting the first circulation conduit 231 may be connected to each other. The conduits constituting the first circulation conduit 231 may be formed at the same level.

The second circulation conduit 232 may be used as a pathway, through which a coolant is circulated. The second circulation conduit 232 may be a spiral structure provided in the supporting plate 230. Alternatively, the second circulation conduit 232 may be configured to include a plurality of ring-shaped conduits, which are formed in a concentric manner, and whose radii are different from each other. In certain embodiments, the conduits constituting the second circulation conduit 232 may be connected to each other. The second circulation conduit 232 may be provided to have a sectional area larger than that of the first circulation conduit 231. The conduits constituting the second circulation conduit 232 may be formed at the same level. The second circulation conduit 232 may be positioned below the first circulation conduit 231.

The second supplying conduit 233 may be extended upward from the first circulation conduit 231 to connect the first circulation conduit 231 to the top surface of the supporting plate 230. In certain embodiments, the second supplying conduit 233 may include a plurality of conduits, whose number is equal to that of the conduits constituting the first supplying conduit 221, and each of which connects one of the conduits constituting the first circulation conduit 231 to a corresponding one of the conduits constituting the first supplying conduit 221.

The first circulation conduit 231 may be connected to a heat transfer medium storage 231a through a heat transfer medium supplying line 231b. The heat transfer medium storage 231a may be configured to store the heat transfer medium. The heat transfer medium may include at least one of inactive or inert gases. In example embodiments, helium gas may be used as the heat transfer medium. As an example, the helium gas may be supplied to the first circulation conduit 231 through the heat transfer medium supplying line 231b and then may be supplied to the bottom surface of the substrate W through the second supplying conduit 233 and the first supplying conduit 221. The helium gas may serve as a medium for transmitting heat energy from plasma to the electrostatic chuck 210 through the substrate W.

The second circulation conduit 232 may be connected to a coolant storage 232a through a coolant supplying line 232c. The coolant storage 232a may be configured to store the coolant. A cooler 232b may be provided in the coolant storage 232a. The cooler 232b may be configured to quench the coolant to a predetermined temperature. Alternatively, the cooler 232b may be provided on the coolant supplying line 232c. The coolant supplied to the second circulation conduit 232 through the coolant supplying line 232c may be circulated through the second circulation conduit 232 to quench the supporting plate 230. If the supporting plate 230 is quenched, the dielectric plate 220 and the substrate W may also be quenched, and this may make it possible to maintain the temperature of the substrate W to a predetermined temperature.

The focus ring 240 may be provided on an edge region of the electrostatic chuck 210. The focus ring 240 may be shaped like a ring and may be provided along a circumference of the dielectric plate 220. The focus ring 240 may be provided to have a staircase structure; for example, an outer portion 240a of a top surface of the focus ring 240 may be positioned at a higher level than an inner portion 240b thereof. The inner portion 240b of the top surface of the focus ring 240 may be positioned at the same level as the top surface of the dielectric plate 220. The inner portion 240b of the top surface of the focus ring 240 may support the edge region of the substrate W positioned outside the dielectric plate 220. The outer portion 240a of the focus ring 240 may be provided to enclose the edge region of the substrate W. The focus ring 240 may be configured to concentrate plasma generated in the chamber 100 on a region facing the substrate W.

The insulating plate 250 may be positioned below the supporting plate 230. The insulating plate 250 may be provided to have the same or similar sectional area as that of the supporting plate 230. The insulating plate 250 may be positioned between the supporting plate 230 and the lower cover 270. The insulating plate 250 may be formed of or include an insulating material to electrically separate the supporting plate 230 from the lower cover 270.

The lower cover 270 may be provided at a bottom portion of the substrate supporting unit 200. The lower cover 270 may be provided at a position spaced apart upward from the bottom surface of the housing 110. The lower cover 270 may be provided to define a top-open space therein. A top portion of the lower cover 270 may be covered with the insulating plate 250. In example embodiments, the lower cover 270 may be provided to have an outer radius which is substantially equivalent to that of the insulating plate 250. A lift pin module (not shown) may be provided in the space defined by the lower cover 270. For example, the lift pin module may be used to move the substrate W from an external transferring member to the electrostatic chuck 210, when the substrate W is loaded on the chamber 100.

The lower cover 270 may include a connection member 273. The connection member 273 may be provided to connect an outer side surface of the lower cover 270 to an inner side surface of the housing 110. The connection member 273 may include a plurality of parts, which are provided spaced apart from each other and are connected to the outer side surface of the lower cover 270. The connection member 273 may be a structure, which is provided in the chamber 100 to support the substrate supporting unit 200. Further, the connection member 273 may be connected to the inner side surface of the housing 110, and this may allow the lower cover 270 to be electrically grounded. A first power line 223c connected to the first lower power 223a, a second power line 225c connected to the second lower power 225a, the heat transfer medium supplying line 231b connected to the heat transfer medium storage 231a, and the coolant supplying line 232c connected to the coolant storage 232a may be extended into the lower cover 270 through an internal space of the connection member 273.

The gas supplying unit 300 may supply a process gas into the chamber 100. The gas supplying unit 300 may include a gas supplying nozzle 310, a gas supplying line 320, and a gas storage 330. The gas supplying nozzle 310 may be installed at a central region of the sealing cover 120. The gas supplying nozzle 310 may include an injection opening formed at a bottom thereof. The injection opening may be positioned below the sealing cover 120 to supply the process gas into a process space provided in the chamber 100. The gas supplying line 320 may connect the gas supplying nozzle 310 to the gas storage 330. The gas supplying line 320 may supply the process gas stored in the gas storage 330 to the gas supplying nozzle 310. A valve 321 may be installed on the gas supplying line 320. The valve 321 may control an on/off operation of the gas supplying line 320 and thereby control a flow rate of the process gas supplied through the gas supplying line 320.

The plasma generating unit 400 may be configured in such a way that the process gas supplied into the chamber 100 is excited to a plasma state. In example embodiments, the plasma generating unit 400 may be configured to be of the ICP type.

The plasma generating unit 400 may include a high frequency power 420, a primary antenna 411, a secondary antenna 413, and a power divider 430. The high frequency power 420 may generate high frequency signals. As an example, the high frequency power 420 may be an RF power 420. The RF power 420 may be configured to generate an RF power. The description that follows will refer to an example of the present embodiment in which the RF power 420 is used as the high frequency power 420. The primary antenna 411 may be connected to the high frequency power 420 through a first line L1. The secondary antenna 413 may be connected to the high frequency power 420 through a second line L2. The second line L2 may diverge from a junction P of the first line L1. Each of the primary antenna 411 and the secondary antenna 413 may be provided in the form of a coil with a plurality of windings. The primary antenna 411 and the secondary antenna 413 may be electrically connected to the RF power 420 and may be applied with the RF power. The power divider 430 may divide the electric power provided from the RF power 420 to respective antennas.

The primary antenna 411 and the secondary antenna 413 may be disposed to face the substrate W. For example, the primary antenna 411 and the secondary antenna 413 may be installed on the process chamber 100. One or both of the primary antenna 411 and the secondary antenna 413 may be provided to have a ring shape. Here, the primary antenna 411 may have a radius smaller than that of the secondary antenna 413. For example, the primary antenna 411 may be provided on an inner region of a top surface of the process chamber 100, and the secondary antenna 413 may be provided on an outer region of the top surface of the process chamber 100.

In certain embodiments, the primary and secondary antennas 411 and 413 may be provided on an outer sidewall of the process chamber 100. Alternatively, one of the primary and secondary antennas 411 and 413 may be provided on the process chamber 100, and the other may be provided on the outer sidewall of the process chamber 100. If a plurality of antennas can be used to generate plasma in the process chamber 100, positions of the coils may not be limited.

The primary and secondary antennas 411 and 413 may exploit the RF power applied from the RF power 420 to induce a time-varying electromagnetic field, allowing the process gas supplied into the process chamber 100 to be excited to a plasma state.

The baffle unit 500 may be positioned between the inner side surface of the housing 110 and the substrate supporting unit 200. The baffle unit 500 may include a baffle with at least one through hole. The baffle may be provided in the form of a circular ring. The process gas to be supplied into the housing 110 may pass through the through holes of the baffle and then may be exhausted to the exhausting hole 102. Shapes of the baffle and the through holes may be variously changed to control a flow of the process gas.

Figure 2:
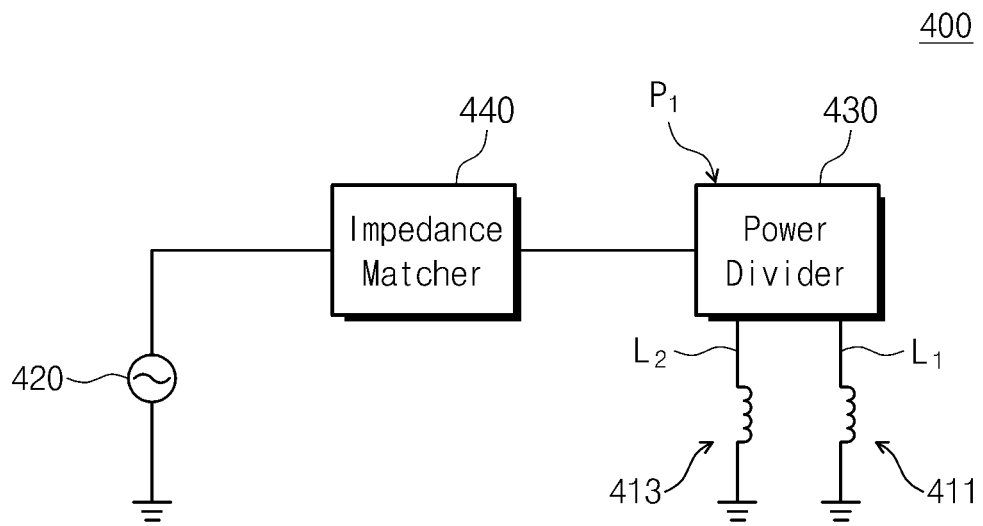
FIG. 2 is a diagram exemplarily illustrating a plasma generating unit according to example embodiments of the inventive concept.

FIG. 2 is a diagram exemplarily illustrating the plasma generating unit 400 according to example embodiments of the inventive concept.

As shown in FIG. 2, the plasma generating unit 400 may include the RF power 420, the primary antenna 411, the secondary antenna 413, and the power divider 430.

The RF power 420 may be configured to generate an RF signal. In example embodiments, the RF power 420 may be configured to generate a sinusoidal wave with a predetermined frequency. However, a wave form of the RF signal generated by the RF power 420 may not limited thereto; for example, the RF signal may be generated to have a shape of sawtooth or chopping wave.

The primary and secondary antennas 411 and 413 may be configured to utilize the RF signal transmitted from the RF power 420 and thereby induce an electromagnetic field for generating plasma. Although the plasma generating unit 400 with two antennas 411 and 413 is exemplarily illustrated in FIG. 2, the number of the antennas may not be limited thereto. For example, the plasma generating unit 400 may be configured to include three or more antennas. The primary antenna 411 may be connected to the RF power 420 through the first line L1. The secondary antenna 413 may be connected to the RF power 420 through the second line L2. The second line L2 may be connected to the first line L1 at a first junction P1.

The power divider 430 may be installed between the RF power 420 and the plurality of antennas 411 and 413 to distribute an electric power from the RF power 420 to respective antennas.

The plasma generating unit 400 may further include an impedance matcher 440. The impedance matcher 440 may be connected to an output terminal of the RF power 420 and may be configured to match output impedance of the RF power 420 to input impedance of a load.

Figure 3:
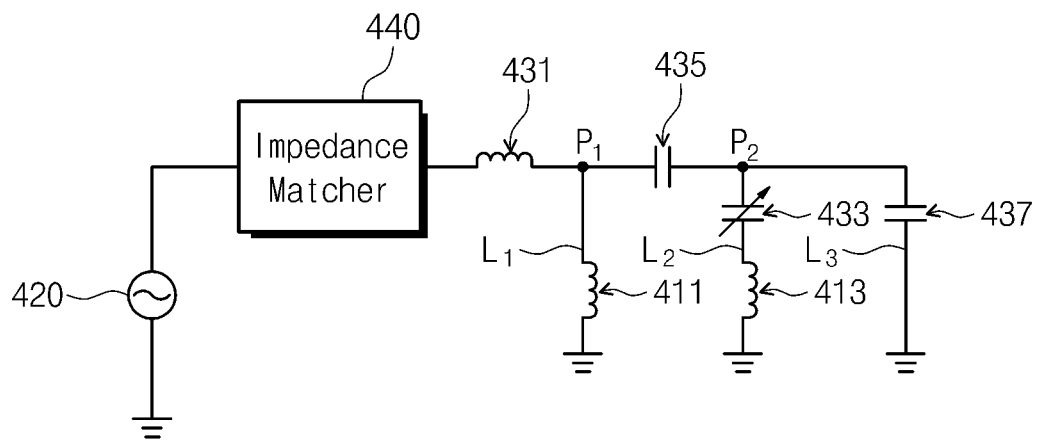
FIG. 3 is a diagram exemplarily illustrating a power divider according to example embodiments of the inventive concept.

FIG. 3 is a diagram exemplarily illustrating the power divider 430, according to example embodiments of the inventive concept.

As shown in FIG. 3, the power divider 430 may include a first reactance device 431, a variable reactance device 433, a second reactance device 435, and a third reactance device 437. The first reactance device 431 may be installed on the first line L1. The first reactance device 431 may be an inductor. The variable reactance device 433 may be connected in series to one of the primary and secondary antennas 411 and 413. As an example, the variable reactance device 433 may be connected in series to the secondary antenna 411. The variable reactance device 433 may include a variable capacitor 433. The variable reactance device 433 may be installed on a segment of the second line L2, which is provided to connect a second junction P2 to the secondary antenna 413. The second reactance device 435 may be installed on the second line L2. As an example, the second reactance device 435 may be installed on another segment of the second line L2, which is provided to connect the first junction P1 to the second junction P2. The second reactance device 435 may be a capacitor. The third reactance device 437 may be installed on a third line L3. The third line L3 may diverge from the second line L2 at the second junction P2. The third reactance device 437 and the secondary antenna 413 may be connected in parallel to the second junction P2. As an example, the third reactance device 437 may be a capacitor.

Figure 4:
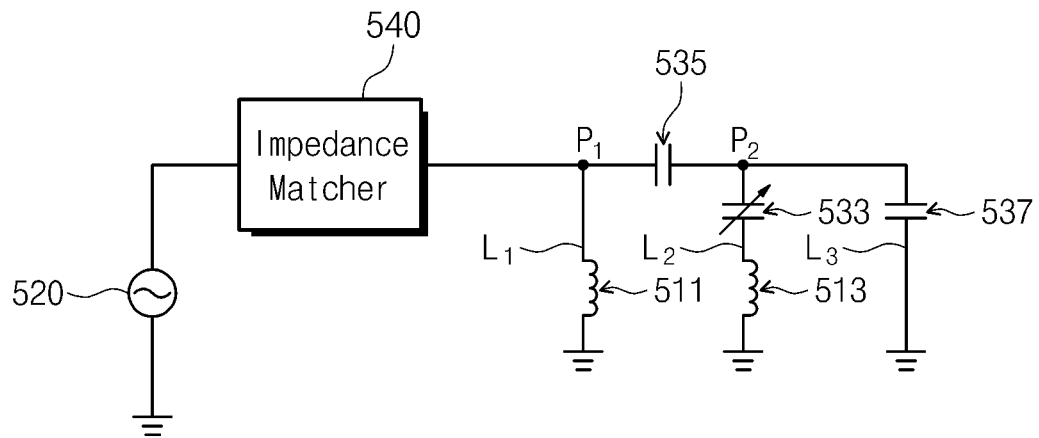
FIG. 4 is a diagram exemplarily illustrating a power divider according to other example embodiments of the inventive concept.

FIG. 4 is a diagram exemplarily illustrating a power divider 530 according to other example embodiments of the inventive concept.

The power divider 530 may include a variable reactance device 533, a second reactance device 535, and a third reactance device 537. The variable reactance device 533, the second reactance device 535, and the third reactance device 537 of FIG. 4 may be configured to have substantially the same shapes or functions as the variable reactance device 433, the second reactance device 435, and the third reactance device 437 described with reference to FIG. 3. However, the first reactance device may not be provided in the power divider 530 of FIG. 4.

The variable reactance device 533, in conjunction with the third reactance device 537, may be configured to induce resonance on the secondary antenna 513. The third reactance device 537 may allow the primary and secondary antennas 511 and 513 to have an averaged operation characteristic, and this makes it possible to stabilize overall operation characteristics of an RF system. Further, the second reactance device 535 may be provided between the primary and secondary antennas 511 and 513 to control a power coupling effect between the primary and secondary antennas 511 and 513. The variable reactance device 533 may control a current flowing through the secondary antenna 513 and/or through the primary antenna 511.

As described above, in the case where the antennas are designed to have impedance characteristics inversely proportional to each other, it is possible to more easily control magnitudes of electric powers to be supplied to respective antennas and a ratio therebetween.

Figure 5:
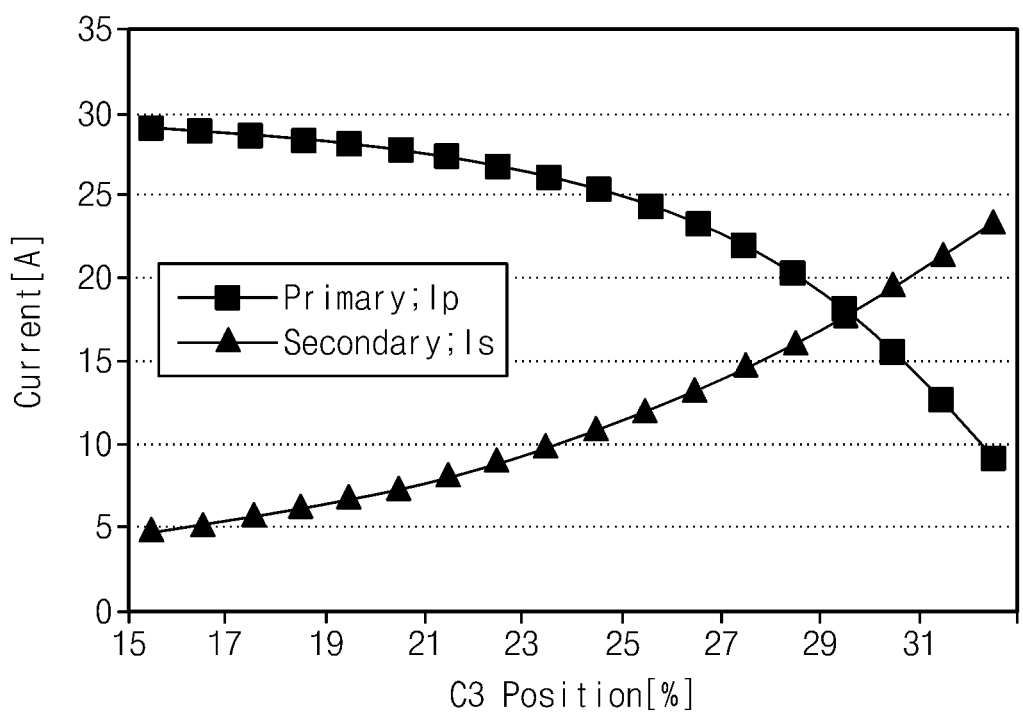
FIGS. 5 and 6 are graphs showing electric currents on the primary and secondary antennas of FIG. 3 and a ratio therebetween, respectively.
Figure 6:
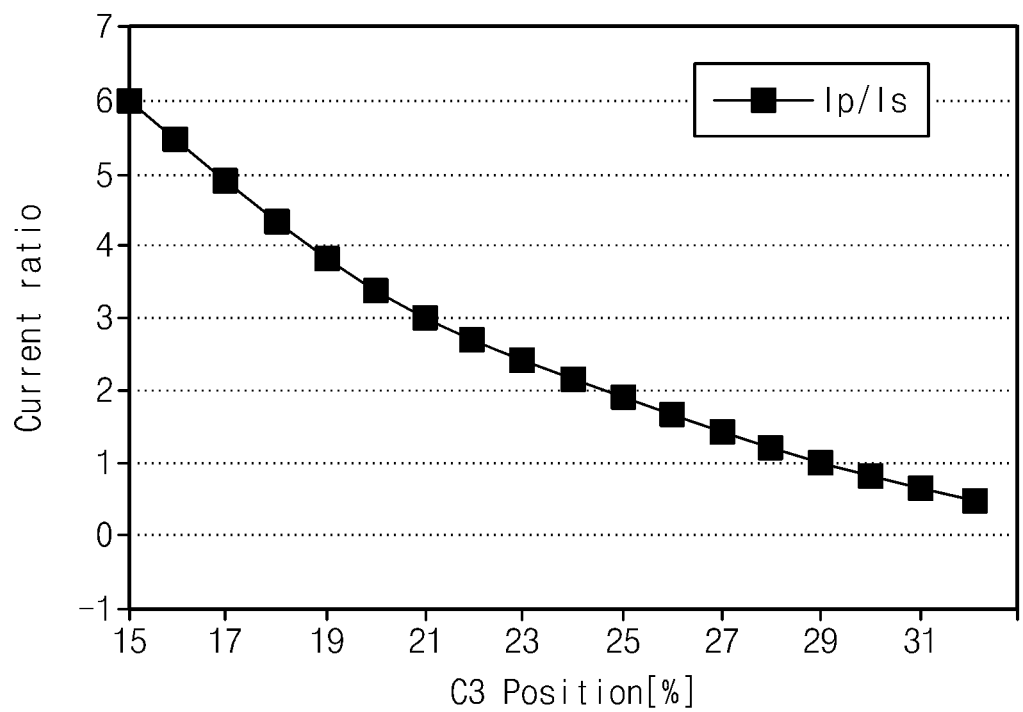

FIGS. 5 and 6 are graphs showing electric currents on the primary and secondary antennas 411 and 413 of FIG. 3 and a ratio therebetween, respectively. FIGS. 5 and 6 show the electric currents and a ratio therebetween, which were measured when the variable reactance device 433 was changed. As shown in FIG. 6, a ratio of a first current Ip passing through the primary antenna 411 to a second current Is passing through the secondary antenna 413 was changed in a range from 0.5 to 6.5.

Each of the variable devices may be configured in such a way that its electrical characteristics can be changed by a control signal transmitted from a controller (not shown). In other words, by adjusting the electrical characteristics of the variable devices under the control of the controller, it is possible to generate plasma having physical properties suitable for a plasma process.

According to afore-described example embodiments of the inventive concept, it is possible to realize, in a wider range, load impedance seen by the RF power 420 (i.e., the impedance Z1 of the primary antenna 411 and the impedance Z2 of the secondary antenna 413).

As a result, it becomes easier to design the primary and secondary antennas 411 and 413, and moreover, it is possible to more easily control magnitudes of electric powers to be supplied to respective coils and a ratio therebetween.

According to example embodiments of the inventive concept, it is possible to control an amount and dividing ratio of electric power to be supplied to each coil in a wide range.

While example embodiments of the inventive concepts have been particularly shown and described, it will be understood by one of ordinary skill in the art that variations in form and detail may be made therein without departing from the spirit and scope of the attached claims.

What is claimed is:

1. A substrate treatment apparatus, comprising:
    a process chamber;
    a supporting unit provided in the process chamber to support a substrate;
    a gas supplying unit configured to supply a process gas into the process chamber; and
    a plasma generating unit configured to generate a plasma from the process gas supplied into the process chamber,
    wherein the plasma generating unit includes,
        a high frequency power;
        an impedance matcher connected to an output terminal of the high frequency power;
        a first reactance device on a first segment between the impedance matcher and a first junction;
        a primary antenna on a first line, the first line being between the first junction and a first ground terminal;
        a second reactance device on a second segment, the second segment being between the first junction and a second junction;
        a secondary antenna on a second line, the second line being between the second junction and a second ground terminal;
        a variable reactance device on a third segment, the third segment being between the second junction and the secondary antenna, the variable reactance device being in series with the secondary antenna, the first reactance device and the second reactance device, the variable reactance device being the lone variable reactance device downstream of the impedance matcher relative to a normal flow of an electrical current through the substrate treatment apparatus during an operational use of the substrate treatment apparatus; and
        a third reactance device on a third line, the third line being between the second junction and a third ground terminal, the first reactance device, the second reactance device, the variable reactance device and the third reactance device being the lone reactance devices on the first segment, the second segment, the third segment and the third line, respectively.

2. The substrate treatment apparatus of claim 1, wherein the variable reactance device is a variable capacitor.

3. The substrate treatment apparatus of claim 2, wherein, the first reactance device is an inductor.

4. The substrate treatment apparatus of claim 3, wherein the second reactance device is a first capacitor.

5. The substrate treatment apparatus of claim 4, wherein the third reactance device is a second capacitor.

6. The substrate treatment apparatus of claim 3, wherein the third reactance device is a capacitor.

7. The substrate treatment apparatus of claim 6, wherein the third reactance device is a passive, non-variable capacitor.

8. The substrate treatment apparatus of claim 1, wherein the primary and secondary antennas are provided in the form of a ring, and the primary antenna has a radius smaller than that of the secondary antenna.

9. The substrate treatment apparatus of claim 1, wherein the primary and secondary antennas are provided on a top part of the process chamber.

10. The substrate treatment apparatus of claim 1, wherein the variable reactance device is the lone variable reactance device downstream of the impedance matcher relative to a normal flow of an electrical current through the substrate treatment apparatus during an operational use of the substrate treatment apparatus.

11. A plasma generating unit, comprising:
    a high frequency power configured to generate a high frequency signal;
    an impedance matcher connected to an output terminal of the high frequency power;
    a first reactance device on a first segment between the impedance matcher and a first junction;
    a primary antenna on a first line, the first line being between the first junction and a first ground terminal;
    a second reactance device on a second segment, the second segment being between the first junction and a second junction;
    a secondary antenna on a second line, the second line being between the second junction and a second ground terminal;
    a variable reactance device on a third segment, the third segment being between the second junction and the secondary antenna, the variable reactance device being in series with the secondary antenna, the first reactance device and the second reactance device, the variable reactance device being the lone variable reactance device downstream of the impedance matcher relative to a normal flow of an electrical current through the plasma generating unit during an operational use of the plasma generating unit; and
    a third reactance device on a third line, the third line being between the second junction and a third ground terminal, the first reactance device, the second reactance device, the variable reactance device and the third reactance device being the lone reactance devices on the first segment, the second segment, the third segment and the third line, respectively.

12. The plasma generating unit of claim 11, wherein the variable reactance device is a variable capacitor.

13. The plasma generating unit of claim 12, wherein the first reactance device is an inductor.

14. The plasma generating unit of claim 13, wherein the second reactance device is a first capacitor.

15. The plasma generating unit of claim 14, wherein the third reactance device is a second capacitor.

16. The plasma generating unit of claim 13, wherein the third reactance device is a capacitor.

17. The plasma generating unit of claim 16, wherein the third reactance device is a passive, non-variable capacitor.

18. The plasma generating unit of claim 11, wherein the variable reactance device is the lone variable reactance device downstream of the impedance matcher relative to a normal flow of an electrical current through the plasma generating unit during an operational use of the plasma generating unit.

19. A plasma generating unit, comprising:
- a high frequency power configured to generate a high frequency signal, the high frequency power being connected to a first node;
- a primary antenna and a secondary antenna in parallel connection with the first node;
- a first reactance device and a variable reactance device in series connection on a first segment, the first segment being between the first node and the antenna; and
- a second reactance device on a second segment, the second segment being connected to a second node on the first segment, the second node being between the variable reactance device and the first reactance device, the first reactance device and the variable reactance device being the lone reactance devices on the first segment, the second reactance device being the lone reactance device on the second segment, the variable reactance device being the lone variable reactance device downstream of the first node relative to a normal flow of an electrical current through the plasma generating unit during a normal operational use of the plasma generating unit.

20. The plasma generating unit of claim 19, further comprising:
- a third reactance device on a third segment, the third segment being between the high frequency power and the first node, the first reactance device being a first capacitor, the second reactance device being a second capacitor, the third reactance device being an inductor and the variable reactance device being a variable capacitor.

* * * * *